United States Patent
Roy et al.

(10) Patent No.: US 9,177,633 B2
(45) Date of Patent: Nov. 3, 2015

(54) BIT LINE WRITE ASSIST FOR STATIC RANDOM ACCESS MEMORY ARCHITECTURES

(71) Applicant: LSI Corporation, San Jose, CA (US)

(72) Inventors: Rajiv Kumar Roy, Bangalore (IN); Rasoju Veerabadra Chary, Bangalore (IN); Rahul Sahu, Uttar Pradesh (IN)

(73) Assignee: Avago Technologies General IP (Singapore) Pte Ltd, Singapore (SG)

( * ) Notice: Subject to any disclaimer, the term of this patent is extended or adjusted under 35 U.S.C. 154(b) by 9 days.

(21) Appl. No.: 14/197,552

(22) Filed: Mar. 5, 2014

(65) Prior Publication Data
US 2015/0255148 A1 Sep. 10, 2015

(51) Int. Cl.
G11C 11/00 (2006.01)
G11C 11/4096 (2006.01)
G11C 11/419 (2006.01)
G11C 7/10 (2006.01)
G11C 11/413 (2006.01)
G11C 7/12 (2006.01)

(52) U.S. Cl.
CPC .......... *G11C 11/4096* (2013.01); *G11C 11/419* (2013.01); *G11C 7/1096* (2013.01); *G11C 7/12* (2013.01); *G11C 11/413* (2013.01)

(58) Field of Classification Search
CPC .......... G11C 11/419; G11C 7/12; G11C 7/18; G11C 11/413; G11C 7/1096; G06F 17/5072
USPC ........ 365/154, 49.11, 63, 129, 156, 174, 188, 365/190, 203, 204
See application file for complete search history.

(56) References Cited

U.S. PATENT DOCUMENTS

| | | | |
|---|---|---|---|
| 8,730,712 B2 * | 5/2014 | Choi | 365/154 |
| 2009/0161411 A1 * | 6/2009 | Kushida | 365/154 |
| 2012/0014172 A1 * | 1/2012 | Jung et al. | 365/154 |
| 2013/0308398 A1 | 11/2013 | Sharad et al. | |
| 2014/0160871 A1 * | 6/2014 | Zimmer et al. | 365/189.16 |
| 2014/0219039 A1 * | 8/2014 | Jung et al. | 365/189.16 |

* cited by examiner

*Primary Examiner* — Fernando Hidalgo
(74) *Attorney, Agent, or Firm* — Duft Bornsen & Fettig, LLP

(57) ABSTRACT

SRAM devices are disclosed that utilize write assist circuits to improve the logical transitions of bit lines. In one embodiment, an SRAM device includes a pair of complimentary bit lines traversing a memory cell array for writing data to memory cells. The bit lines have a first end and a second end. A pair of complimentary write drivers is proximate to the first end of the bit lines that writes to the bit lines. A write assist circuit is proximate to the second end of the bit lines that receives a pre-charge signal to assist the write drivers in transitioning the bit lines from a logical zero state to a logical one state. The write assist circuit also receives a boost signal to assist the write drivers in transitioning the bit lines from a logical one state to a logical zero state.

19 Claims, 5 Drawing Sheets

US 9,177,633 B2

BIT LINE WRITE ASSIST FOR STATIC RANDOM ACCESS MEMORY ARCHITECTURES

FIELD OF THE INVENTION

The invention generally relates to field of Static Random Access Memories (SRAM), and in particular, to write processes for SRAM.

BACKGROUND

Submicron SRAM experiences performance problems in 20 nm and below process technologies due to the increased parasitic capacitances and resistances of bit lines. The increased parasitic effects degrade the slope of the bit lines during write operations, thereby increasing the cycle times for writing data to SRAM memory cells. However, increasing the size of write drivers for the bit lines fails to improve the slope of the bit line during logical state transitions because the current capabilities of the write drivers tend to saturate even as the size of the drivers are increased.

SUMMARY

SRAM devices are disclosed herein that utilize write assist circuits for bit lines of the devices to improve the logical transitions of the bit lines during write operations. In one embodiment, an SRAM device includes a memory cell array. The SRAM device further includes a pair of complimentary bit lines traversing the memory cell array for writing data to memory cells of the memory cell array. Each of the bit lines has a first end and a second end. The SRAM device further includes a pair of complimentary write drivers proximate to the first end of the bit lines. A first of the write drivers is configured to write to a first of the bit lines and a second of the write drivers is configured to write to a second of the bit lines. The SRAM device further includes a write assist circuit proximate to the second end of the bit lines that is configured to receive a pre-charge signal to assist the write drivers in transitioning the bit lines from a logical zero state to a logical one state. The write assist circuit is further configured to receive a boost signal to assist the write drivers in transitioning the bit lines from a logical one state to a logical zero state.

The various embodiments disclosed herein may be implemented in a variety of ways as a matter of design choice. For example, some embodiments herein are implemented in hardware whereas other embodiments may include processes that are operable to construct and/or operate the hardware. Other exemplary embodiments are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
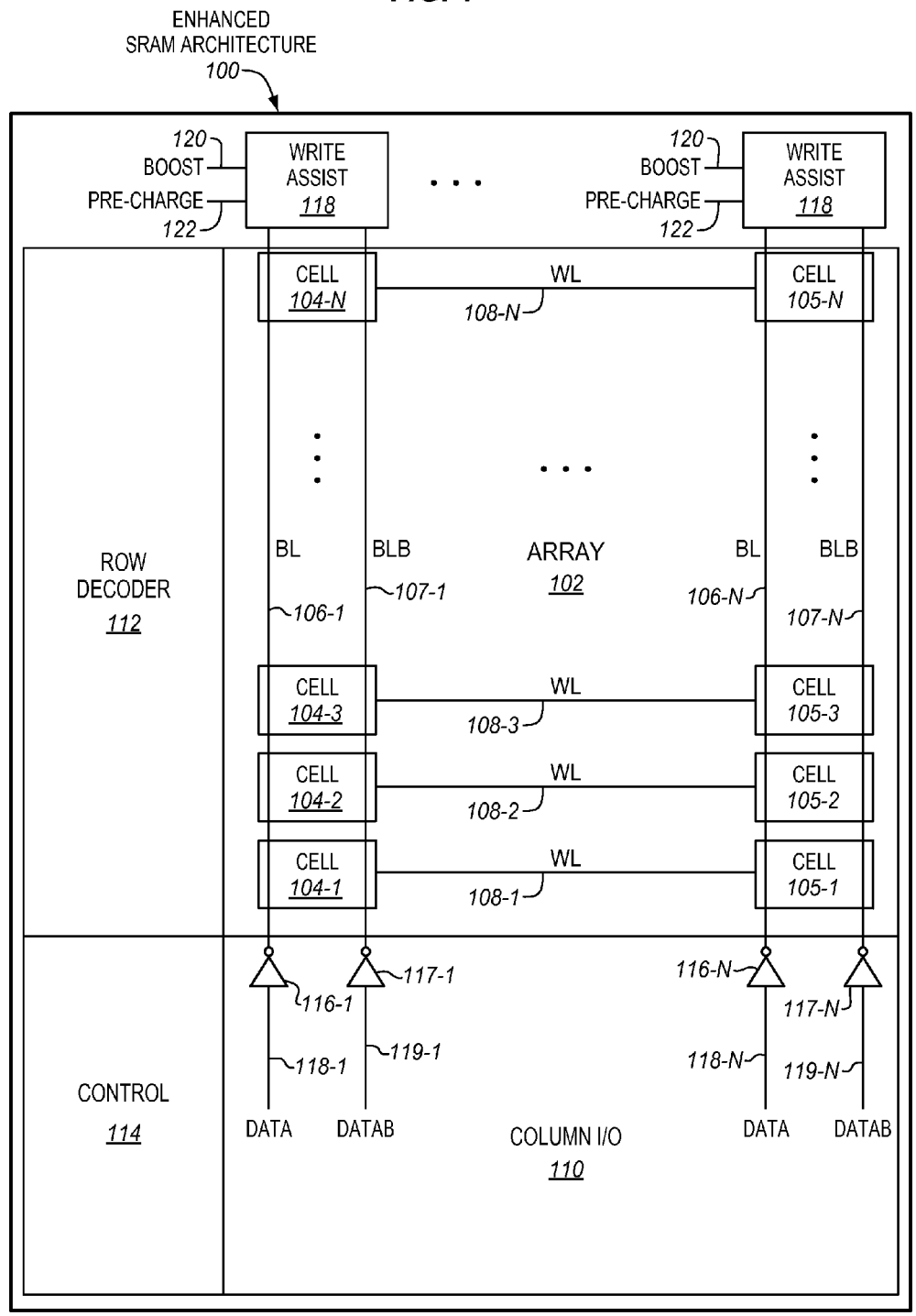
FIG. 1 is a block diagram of an enhanced SRAM architecture in an exemplary embodiment.

FIG. 1 is a block diagram of an enhanced SRAM architecture 100 in an exemplary embodiment. Architecture 100 is a simplified block diagram view that will be used to discuss the inventive aspects of the SRAM devices disclosed herein. But, architecture 100 is not intended to limit the implementation to any particular embodiment. Those skilled in the art will understand that additional components not shown or described in FIG. 1, such as drivers, latches, decoders, sense amps, etc. may be used to implement architecture 100 in various configurations as a matter of design choice.

Architecture 100 in this embodiment includes an array 102 of memory cells 104-105. Memory ells 104-105 are disposed in array 102 at the intersections of column bit lines and row word lines within array 102. For instance, memory cell 104-1 is disposed in array 102 where complimentary bit lines BL 106-1 and BLB 107-1 intersect word line WL 108-1. To access memory cell 104-1, WL 108-1 is asserted utilizing a row decoder circuit 112, and bit data stored at memory cell 104-1 is read out, or written by, bit lines 106-107 utilizing a column I/O circuit 110. Although not shown in FIG. 1, memory cells 104-105 may utilize a bistable latch circuit to store a bit of data (e.g., a 6 transistor SRAM cell), although the particular implementation of memory cells 104-105 is a matter of design choice.

Also illustrated in FIG. 1 is a plurality of write drivers 116-117 for writing data to memory cells 104-105. In particular, write driver 116-1 is coupled to and drives BL 106-1 based on DATA 118-1. Write driver 117-1 is coupled to and drives BLB 107-1 based on DATAB 119-1. In like manner, write driver 116-N is coupled to and drives BL 106-N based on DATA 118-N, and write driver 117-N is coupled to and drives BLB 107-N based on DATAB 119-N. In this embodiment, write drivers 116-117 are illustrated as inverting write drivers, although other non-inverting configurations may exist as a matter of design choice.

In this embodiment, architecture 100 includes write assist circuit 118. Write assist circuit 118 is disposed proximate to an end of bit lines 106-107 that is away from write drivers 116-117. This allows bit lines 106-107 to be driven from both ends nearly simultaneously, thereby improving the transitions times of bit lines 106-107. Write assist circuit 118 is not simply a replication of write drivers 116-117 but instead is, in part, a pair of cross-coupled transistors placed near an end of bit lines 106-107 that assist write drivers 116-117 in transitioning bit lines 106-107 between logical states. This allows for an improvement in the transition times between logical states without the die size impact of replicating the complete write driver circuit. Further, write assist circuit 118 operates without access to data lines for write drivers 116-117, thereby reducing the amount of signal routing across architecture 100.

In this embodiment, write assist circuit 118 does not rely on DATA 118 and DATAB 119 for write drivers 116-117, but instead operates utilizing a boost signal 120 and pre-charge signal 122 in combination with voltage differences across bit lines 106-107. A control circuit 114 of architecture 100 toggles boost signal 120 and pre-charge signal 122 during write operations to memory cells 104-105 to implement write assist to bit lines 106-107. For instance, control circuit 114 may coordinate the sequencing of logic level changes for boost signal 120 and pre-charge signal 122 as DATA 118-1 and/or DATAB 119-1 change logic states depending on whether bit lines 106-107 are transitioning logical low to logic high or transitioning logic high to logic low. As used herein, the terms logic low, logic zero, and low are used interchangeably. Further, the terms logic high, logic one, and high are used interchangeably.

Figure 2:
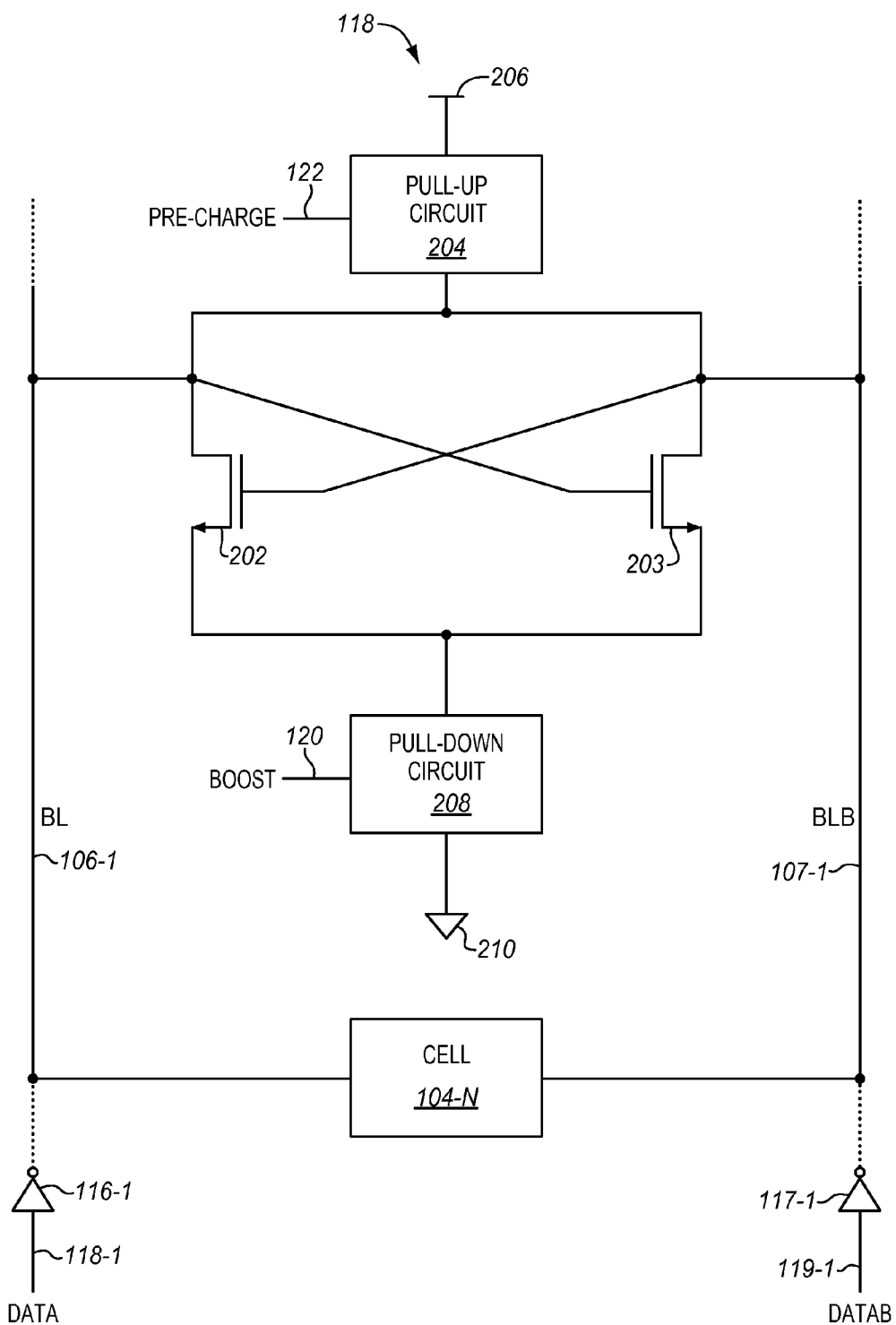
FIG. 2 is a schematic diagram of a bit line write assist circuit in an exemplary embodiment.

FIG. 2 is a schematic diagram of a bit line write assist circuit 118 in an exemplary embodiment. In this embodiment, write assist circuit 118 includes a pair of cross-coupled Metal Oxide Semiconductor Field Effect Transistors (MOSFETS) 202-203, although other embodiments may utilize other types of transistors as a matter of design choice. Transistors 202-203 are cross-coupled by gate, with the drain terminal of transistor 202 coupled to both BL 106-1 and to the gate of transistor 203. In like manner, the drain terminal of transistor 203 is coupled to both BL 107-1 and to the gate of transistor 202.

Write assist circuit 118 in this embodiment further includes a pull-up circuit 204 which is activated by a pre-charge signal 122. Pull-up circuit 204 couples the drain terminal of each transistor 202-203 to a supply voltage 206 (also referred to herein as a logical one reference voltage) in response to pre-charge signal 122 being asserted low. When pull-up circuit 204 is active, supply voltage 206 sources current to charge BL 106-1 and BLB 107-1. Pull-up circuit 204 is utilized to improve the low to high transition time for BL 106-1 and BLB 107-1. For instance, if BL 106-1 is low and being driven high by write driver 116-1, pull-up circuit 204 is used to actively pull BL 106-1 high from the other end of BL 106-1 (i.e., the end of BL 106-1 that is away from write driver 116-1). This improves the low to high transition time for BL 106-1. The low to high transition time for BLB 107-1 is improved in a similar manner.

Write assist circuit 118 in this embodiment further includes a pull-down circuit 208 which is activated by boost signal 120. Pull-down circuit 208 couples the source terminal of each transistor 202-203 to ground 210 (also referred to herein as a logical zero reference voltage) in response to boost signal 120 being asserted high. When pull-down circuit 208 is active, transistors 202-203 will be conducting differently depending on the voltage difference between BL 106-1 and BLB 107-1. This is due to the cross-coupled gate configuration of transistors 202-203. For instance, with BLB 107-1 held high and BL 106-1 going low (e.g., being driven low by write driver 116-1), the gate to source voltage across transistor 202 is held positive with the gate of transistor 202 remaining at supply voltage 206 while the gate to source voltage across transistor 203 is decreasing until it reaches the turn-off voltage and turns off. As transistor 202 remains on, transistor 202 begins to actively pull BL 106-1 low from the other end of BL 106-1 (i.e., the end of BL 106-1 that is away from write driver 116-1) when pull-down circuit 208 is active. This improves the high to low transition time for BL 106-1. The transition time for BLB 107-1 is improved in a similar manner when BL 106-1 is held high and BLB 107-1 is going low.

Figure 3:
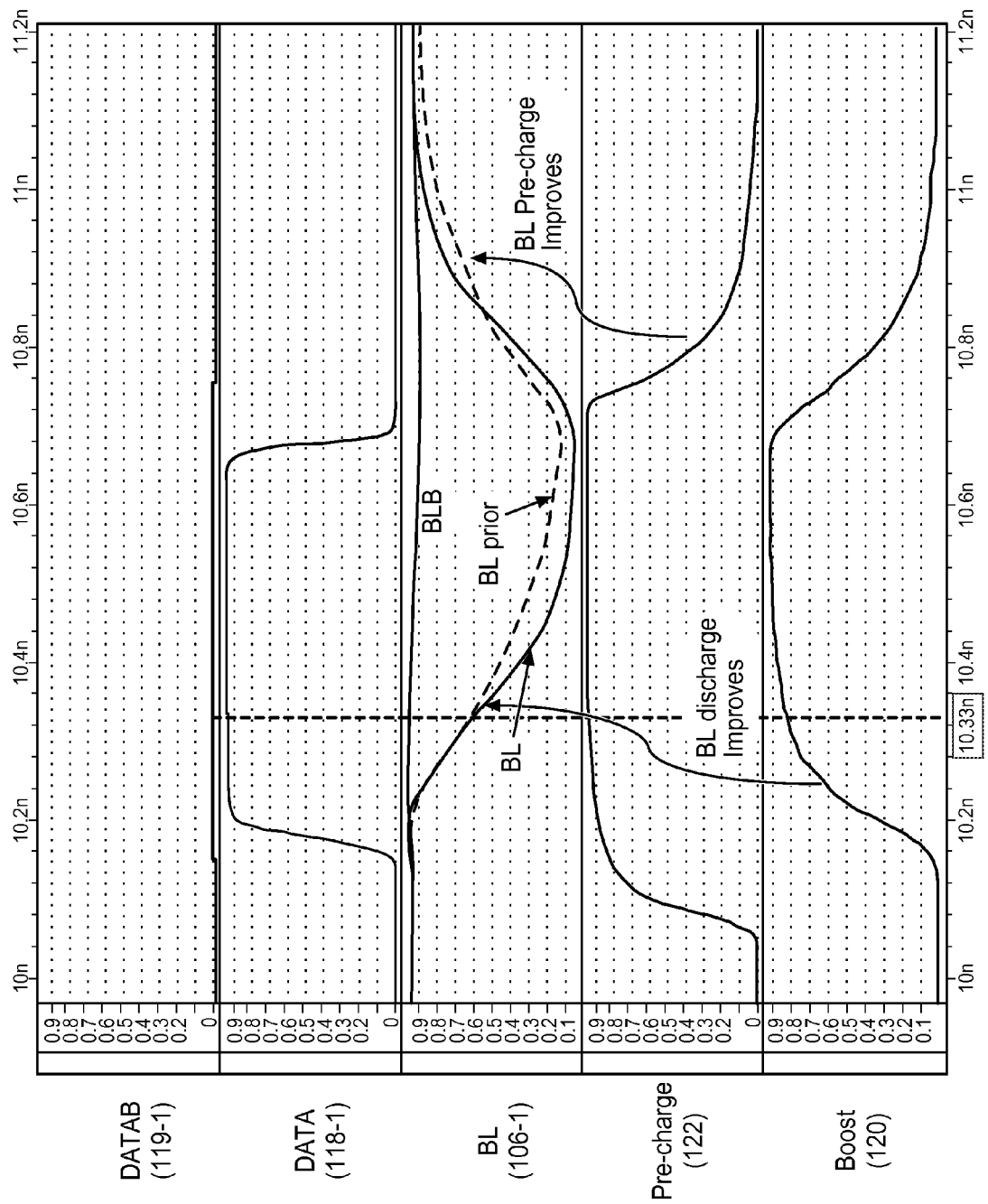
FIGS. 3-4 illustrate timing diagrams for implementing bit line write assist in an exemplary embodiment.
Figure 4:
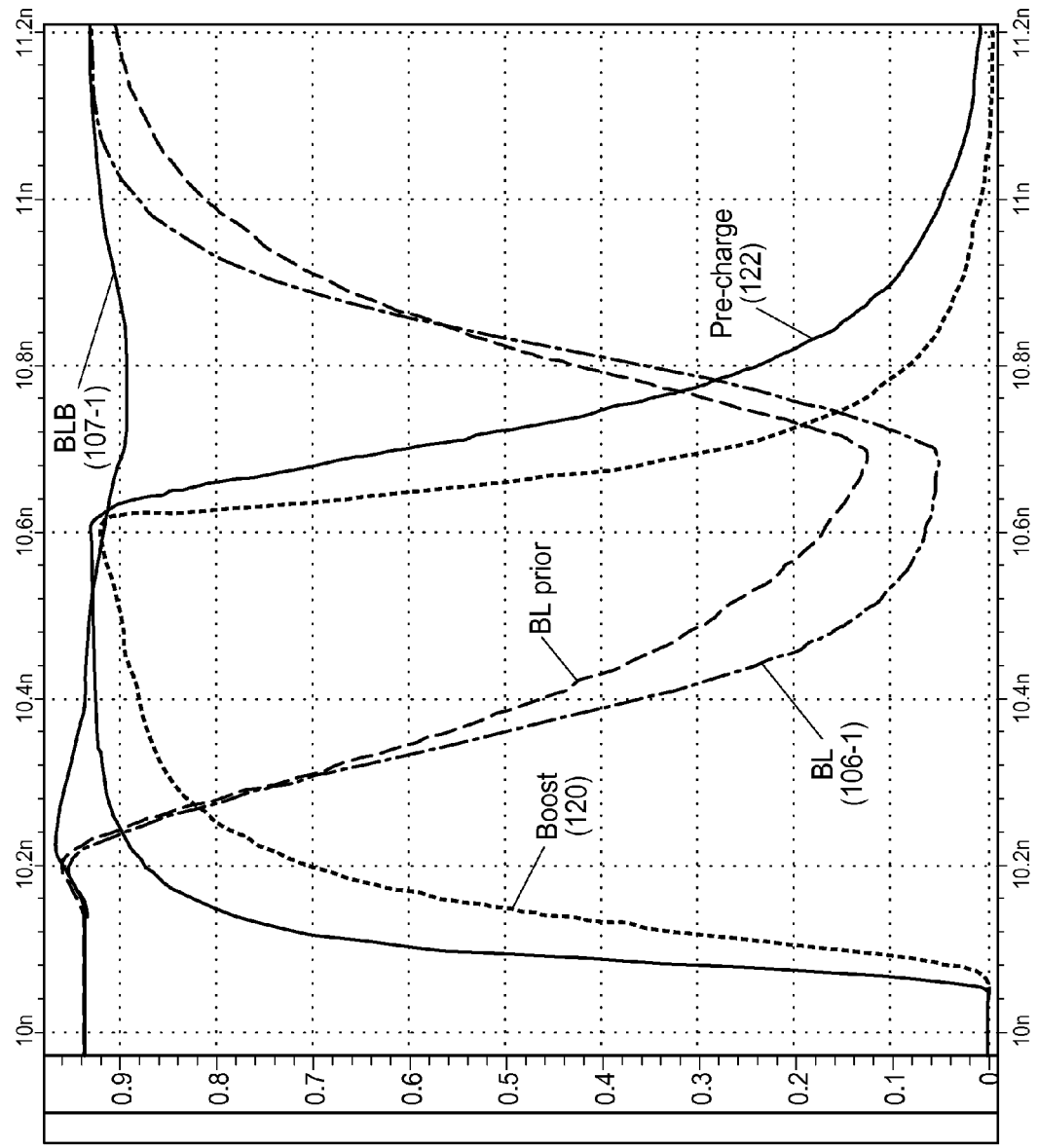

FIGS. 3-4 illustrate timing diagrams for implementing bit line write assist in an exemplary embodiment. In particular, FIG. 4 is a close-in view of the signals illustrated in FIG. 3. FIGS. 3-4 illustrate just one example of the timing relationships between the various signals of FIG. 2 for purposes of discussion. One skilled in the art will recognize that other timing relationships may exist. The first signal illustrated in FIG. 3 is DATAB 119-1, which remains low such that write driver 117-1 drives BLB 107-1 high. BLB 107-1 remains high throughout the rest of the discussion of FIGS. 3-4. Initially, each of the following signals are low: DATA 118-1, pre-charge signal 122, and boost signal 120. BL 106-1 is high. With pre-charge signal 122 low, pull-up circuit 204 (see FIG. 2) pulls BL 106-1 and BLB 107-1 high. With the pre-charge signal 122 going high, it turns off pull-up circuit 204. When DATA 118-1 goes high, write driver 116-1 begins driving BL 106-1 low. As BL 106-1 starts to go low, a voltage differential between BLB 107-1 and BL 106-1 is generated. After some differential has been generated, boost signal 120 starts to go high. With BLB 106-1 going low and BLB 107-1 held high, the gate to source voltage for transistor 203 is decreasing, while the gate to source voltage of transistor 202 remains at supply voltage 206. Thus the BL 106-1 is also pulled low through transistor 202, which is on, while BLB 107-1 is not pulled low because transistor 203 is turning off.

With transistor 202 turning on and pull-down circuit 208 active, transistor 202 discharges BL 106-1 in concert with write driver 116-1, thereby improving the high to low transition time for BL 106-1. This is illustrated in FIGS. 3-4 as the timing differences between BL proposed signal 302 and BL prior signal 304 after boost signal 120 goes high. BL proposed signal 302 illustrates that BL 106-1 transitions to a low level more rapidly utilizing write assist circuit 118 in comparison to BL prior signal 304.

FIGS. 3-4 further illustrates that the low to high transition for BL 106-1 can be improved utilizing write assist circuit 118. After the write operation, boost signal 120 goes low, which turns off pull-down circuit 208. Also DATA 118-1 goes low and write driver 116-1 begins driving BL 106-1 high. Next, pre-charge signal 122 starts to go low, which activates pull-up circuit 204. With pre-charge signal 122 low, pull-up circuit 204 charges BL 106-1 in concert with write driver 116-1, thereby improving the low to high transition time for BL 106-1. This is illustrated FIGS. 3-4 as the timing differences between BL proposed signal 302 and BL prior signal 304 after boost signal 120 goes low. BL proposed signal 302 illustrates that BL 106-1 transitions to a high level more rapidly utilizing write assist circuit 118 in comparison to BL prior signal 304.

Although the previous discussion illustrate the effects of write assist circuit 118 with regard to BL 106-1, the transition times for BLB 107-1 are also improved in a similar manner. For example, DATA 118-1 may be held low while DATAB 119-1 is toggled. In this case, BLB 107-1 would follow a similar voltage profile as that depicted for BL 106-1 in FIGS. 3-4.

Figure 5:
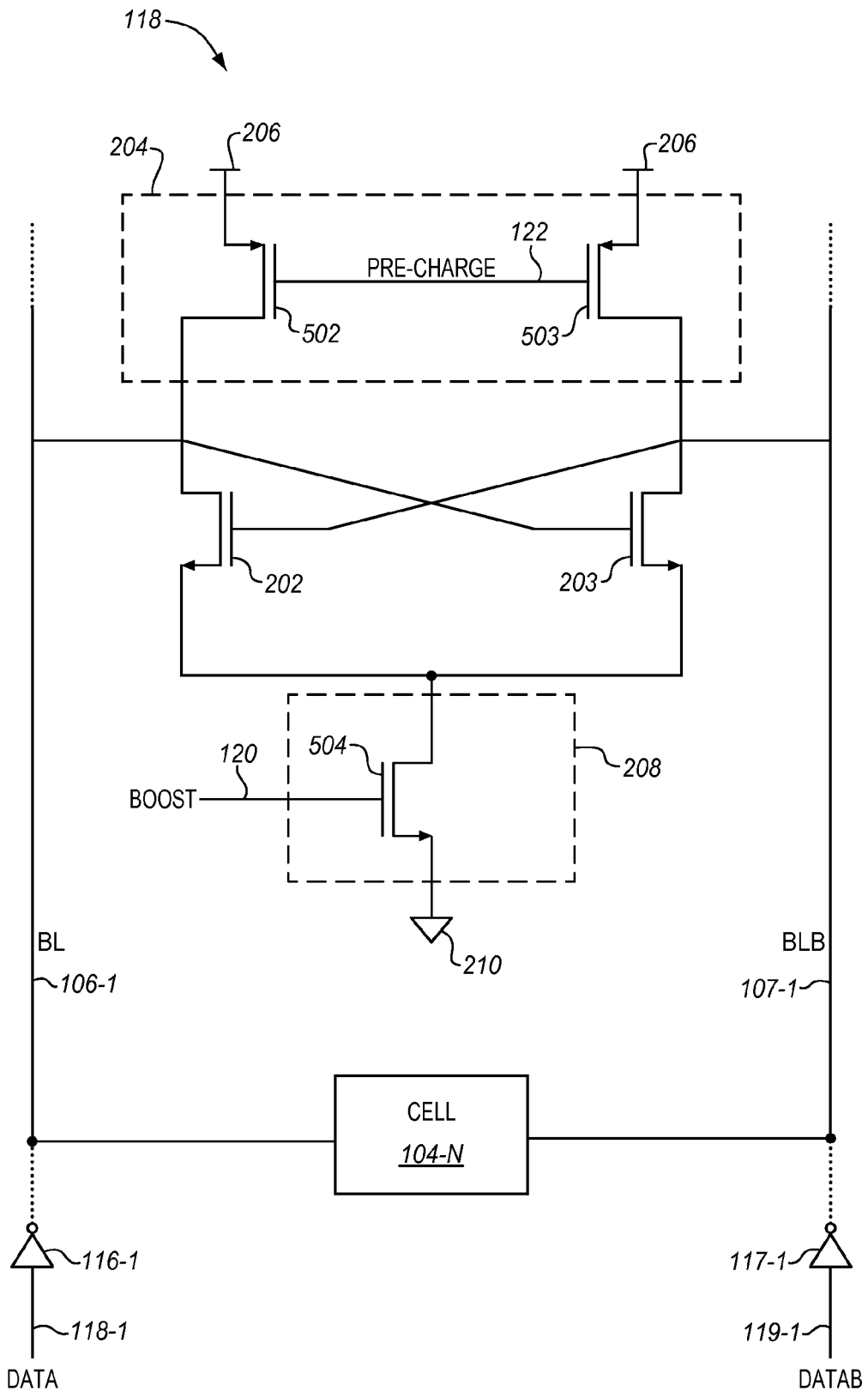
FIG. 5 illustrates another schematic diagram of a bit line write assist circuit in an exemplary embodiment.

FIG. 5 illustrates another schematic diagram of bit line write assist circuit 118 in an exemplary embodiment. In this embodiment, pull-up circuit 204 comprises a pair of MOSFETS 502-503 and pull-down circuit 208 comprises a MOSFET 504. Other types of transistors may be utilized in other configurations as a matter of design choice. In FIG. 5, the source terminals of each of transistors 502-503 are coupled with supply voltage 206. The drain terminal of transistor 502 is coupled to the drain terminal of transistor 202 and to BL 106-1, and the drain terminal of transistor 503 is coupled to the drain terminal of transistor 203 and to BLB 107-1. Pre-charge signal 122 is coupled to the gate terminals of transistors 502-503. When pre-charge signal 122 goes low, transistors 502-503 turn on, which charges bit lines 106-107 via supply voltage 206.

Transistor 504 of pull-down circuit 208 has a drain terminal coupled with the source terminals of transistors 202-203. Transistor 504 also has a source terminal coupled to ground 210 and a gate coupled to boost signal 120. When boost signal 120 is high, transistor 504 turns on, which couples the drain terminals of transistors 202-203 to ground 210.

What is claimed is:

1. A Static Random Access Memory (SRAM) device, comprising:
a memory cell array;
a pair of complimentary bit lines traversing the memory cell array for writing data to memory cells of the memory cell array, wherein each of the bit lines has a first end and a second end;
a pair of complimentary write drivers proximate to the first end of the bit lines, wherein a first of the write drivers is configured to write to a first of the bit lines, wherein a second of the write drivers is configured to write to a second of the bit lines; and
a write assist circuit proximate to the second end of the bit lines that is configured to receive a pre-charge signal to assist the write drivers in transitioning the bit lines from a logical zero state to a logical one state;
the write assist circuit further configured to receive a boost signal to assist the write drivers in transitioning the bit lines from a logical one state to a logical zero state;
wherein the write assist circuit comprises:
a pair of cross-coupled transistors, wherein a first of the transistors has a drain terminal coupled to the first bit line, wherein a second of the transistors has a drain terminal coupled to the second bit line;
a pull-up circuit configured to couple the drain terminal of the first transistor and the drain terminal of the second transistor to a logical one reference voltage in response to receiving the pre-charge signal; and
a pull-down circuit configured to couple the source terminal of the first transistor and the source terminal of the second transistor to a logical zero reference voltage in response to receiving the boost signal.

2. The SRAM device of claim 1 wherein the pull-up circuit comprises:
a third transistor having a source terminal coupled to the logical one reference voltage, a drain terminal coupled to the first bit line, and a gate coupled to the pre-charge signal; and
a fourth transistor having a source terminal coupled to the logical one reference voltage, a drain terminal coupled to the second bit line, and a gate coupled to the pre-charge signal.

3. The SRAM device of claim 1 wherein the pull-down circuit comprises:
a fifth transistor having a source terminal coupled to the drain terminal of the first transistor and to the drain terminal of the second transistor, and having a drain terminal coupled to the logical zero reference voltage.

4. The SRAM device of claim 1 wherein:
the first transistor has a gate terminal coupled to the second bit line; and
the second transistor has a gate terminal coupled to the first bit line.

5. The SRAM device of claim 1 wherein:
the pull-up circuit is configured to couple the drain terminal of the first transistor and the drain terminal of the second transistor to the logical one reference voltage in response to receiving a logical zero pre-charge signal;
the pull-down circuit is configured to couple the source terminal of the first transistor and the source terminal of the second transistor to the logical zero reference voltage in response to receiving a logical one boost signal;
the write drivers are inverting write drivers; and
the SRAM device further comprises:
a control circuit coupled to the first write driver and the write assist circuit, the control circuit configured to toggle the pre-charge signal to a logical one, to toggle a first data signal for the first write driver to a logical one after the pre-charge signal has been toggled, and to toggle the boost signal to a logical one after the first data signal has been toggled.

6. The SRAM device of claim 5 wherein:
the control circuit is configured to toggle the first data signal to a logical zero, to toggle the boost signal to a logical zero after the first data signal has been toggled, and to toggle the pre-charge signal to a logical zero after the boost signal has been toggled.

7. The SRAM device of claim 6 wherein:
the control circuit is configured to hold a second data signal for the second write driver at a logical zero until after the pre-charge signal has been toggled to a logical zero.

8. A Static Random Access Memory (SRAM) device, comprising:
a memory cell array;
a pair of bit lines traversing the memory cell array for writing data to memory cells of the memory cell array;
a pair of write drivers, each coupled to a different one of the bit lines at a first end of the bit lines; and
a write assist circuit coupled to the bit lines at a second end of the bit lines, wherein the write assist circuit comprises:
a first pair of transistors cross-coupled by gate, each having a first terminal coupled to a different one of the bit lines;
a pull-up circuit configured to pull the bit lines to a logical one reference voltage in response to receiving a pre-charge signal; and
a pull-down circuit configured to pull a second terminal of each of the first pair of transistors to a logical zero reference voltage in response to receiving a boost signal.

9. The SRAM device of claim 8 wherein:
the pull-up circuit is configured to pull the bit lines to the logical one reference voltage in response to receiving a logical zero pre-charge signal;
the pull-down circuit is configured to pull the second terminal of each of the first pair of transistors to the logical zero reference voltage in response to receiving a logical one boost signal;
the pair of write drivers comprises:
a first inverting write driver configured to write to a first bit line of the pair of bit lines based on a first data signal; and
a second inverting write driver configured to write to a second bit line of the pair of bit lines based on a second data signal; and
the SRAM device further comprises:
a control circuit coupled to the first write driver, the second write driver, and the write assist circuit, the control circuit configured to toggle the pre-charge signal to a logical one, to toggle the first data signal to a logical one after the pre-charge signal has been toggled, and to toggle the boost signal to a logical one after the first data signal has been toggled.

10. The SRAM device of claim 9 wherein:
the control circuit is configured to toggle the first data signal to a logical zero, to toggle the boost signal to a logical zero after the first data signal has been toggled, and to toggle the pre-charge signal to a logical zero after the boost signal has been toggled.

11. The SRAM device of claim 10 wherein:
the control circuit is configured to hold the second data signal at a logical zero until after the pre-charge signal has been toggled to a logical zero.

12. The SRAM device of claim 8 wherein:
the first terminal of each of the first pair of transistors is a drain terminal; and
the second terminal of each of the first pair of transistors is a source terminal.

13. The SRAM device of claim 12 wherein:
the pull-up circuit comprises:
a second pair of transistors, each having a source terminal coupled to a logical one reference voltage, a drain terminal coupled to a different one of the bit lines, and a gate coupled to the pre-charge signal.

14. The SRAM device of claim 13 wherein:
the pull-down circuit comprises:
a transistor having a gate coupled to the boost signal, a drain terminal coupled to the source terminal of each of the first pair of transistors, and a drain terminal coupled to a logical zero reference voltage.

15. A Static Random Access Memory (SRAM) device, comprising:
a pair of bit lines traversing a memory cell array for writing data to memory cells of the memory cell array;
a pair of write drivers, each coupled to a different one of the bit lines at a first end of the bit lines;
a pair of transistors cross-coupled by gate, each having a first terminal coupled to a different one of the bit lines at a second end of the bit lines;
a pull-up circuit configured to pull the bit lines to a logical one reference voltage in response to receiving a pre-charge signal; and
a pull-down circuit configured to pull a second terminal of each of the transistors to a logical zero reference voltage in response to receiving a boost signal.

16. The SRAM device of claim 15 wherein:
the pair of write drivers comprises:
a first inverting write driver configured to write to a first bit line of the pair of bit lines based on a first data signal; and
a second inverting write driver configured to write to a second bit line of the pair of bit lines based on a second data signal; and
the SRAM device further comprises:
a control circuit configured to toggle the pre-charge signal to a logical one, to toggle the first data signal to a logical one after the pre-charge signal has been toggled, and to toggle the boost signal to a logical one after the first data signal has been toggled.

17. The SRAM device of claim 16 wherein:
the control circuit is configured to toggle the first data signal to a logical zero, to toggle the boost signal to a logical zero after the first data signal has been toggled, and to toggle the pre-charge signal to a logical zero after the boost signal has been toggled.

18. The SRAM device of claim 17 wherein:
the control circuit is configured to hold the second data signal at a logical zero until after the pre-charge signal has been toggled to a logical zero.

19. The SRAM device of claim 15 wherein:
the first terminal of each of the first pair of transistors is a drain terminal; and
the second terminal of each of the first pair of transistors is a source terminal.

\* \* \* \* \*